United States Patent
Hwu et al.

(10) Patent No.: US 8,772,819 B2
(45) Date of Patent: Jul. 8, 2014

(54) MULTI-LAYER ARRAY TYPE LED DEVICE

(75) Inventors: Jon-Fwu Hwu, Hsinchu (TW); Yung-Fu Wu, Hsinchu (TW); Kui-Chiang Liu, Hsinchu (TW)

(73) Assignee: Gem Weltronics TWN Corporation, Hsinchu County (TW)

( * ) Notice: Subject to any disclaimer, the term of this patent is extended or adjusted under 35 U.S.C. 154(b) by 168 days.

(21) Appl. No.: 13/354,269

(22) Filed: Jan. 19, 2012

(65) Prior Publication Data

US 2013/0187175 A1    Jul. 25, 2013

(51) Int. Cl.
*H01L 33/00*    (2010.01)

(52) U.S. Cl.
USPC ...... 257/99; 257/100; 257/434; 257/E33.065; 257/E33.059; 438/28; 438/69; 438/956

(58) Field of Classification Search
USPC ........... 257/13, 79, 81, 84, 88, 89, 93, 95, 98, 257/99, 100, 434, E33.058, E33.065, 257/E33.059; 438/25, 26, 27, 28, 69, 956
See application file for complete search history.

(56) References Cited

U.S. PATENT DOCUMENTS

| | | | | |
|---|---|---|---|---|
| 2009/0162957 | A1* | 6/2009 | Joung | 438/27 |
| 2010/0155771 | A1* | 6/2010 | Bando | 257/99 |
| 2012/0043573 | A1* | 2/2012 | Mitsuishi et al. | 257/98 |
| 2012/0061717 | A1* | 3/2012 | Lee et al. | 257/99 |

* cited by examiner

*Primary Examiner* — Su Kim

(57) ABSTRACT

A multi-layer array type LED device is provided, which includes a substrate, an encapsulation body, two lead frames, a plurality of LED dices, and a set of optical lens. The outer circumferential edge and the upper and lower periphery of the substrate are completely encapsulated by the encapsulation body so that the multi-layer array type LED device can be tightly packaged. In the present invention, a fluorescent layer is disposed between an optical grease layer and a silica gel protection layer, and thereby the fluorescent layer is protected, and is capable of preventing moisture from permeating therein. On the other hand, in the present invention, the reflection coefficient of the optical grease layer is at least larger than a certain value so that the probability of the light emitted out of the optical chamber can be increased.

5 Claims, 7 Drawing Sheets

MULTI-LAYER ARRAY TYPE LED DEVICE

BACKGROUND OF THE INVENTION

1. Field of the Invention

The present invention relates to a multi-layer array type LED (light-emitting diode) device, and particularly relates to a multi-layer array type LED device with high luminous efficiency, which is capable of completely preventing moisture from permeating into the optical elements disposed therein.

2. The Prior Arts

The light-emitting theory of LED takes advantage of the intrinsic properties of semiconductors, which is different from the theory of electric discharging, heat and light-emitting of an incandescent light tube. Because light is emitted when electric current forward flows across the PN junction of a semiconductor, the LED is also called cold light. The LED has the features of high durability, long service life, light weight, low power consumption, and being free of toxic substances like mercury, and thereby it can be widely used in the industry of luminance equipment, and the LEDs are often arranged in an array and often used in electric bulletin boards or traffic signs.

In a conventional method for packaging a multi-layer array type LED, a substrate is provided, and two lead frames are positioned in the lead frame groove of the substrate, and then a package module is injection molded so as to encapsulate and fix the substrate and the two lead frames, and then the LED dices are arranged in the light-emitting area of the substrate, and the LED dices are electrically connected to the two lead frames, and then an insulating protection layer, and a fluorescent layer are sequentially formed on the LED dices, and then the package cover is injected to cover the package module. The LED dices are arranged in an array, and stacked one on top of another so as to form a multi-layered structure.

However, the conventional LED device cannot be used in high-moisture environments, and severe environments such as deep sea, air space, or military. This is because each layer of the packaging structure is not airtightly connected to each other, and therefore the whole packaging structure can not be airtight. Consequently, the moisture can easily enter the interior of the packaging structure, which causes the optical elements in the packaging structure to deteriorate over time. As a result, the conventional packaging structure can not be used in a moist environment because the structural strength thereof will be gradually weakened. On the other hand, the light reflector must be manufactured before it is arranged in the LED device, which would cause the packaging efficiency to go down. In view of the above-mentioned disadvantages, a LED packaging structure, which is capable of completely preventing moisture from permeating through to it, being durable in use, and keeping the performance of optical elements for a long term, shall be provided.

SUMMARY OF THE INVENTION

An objective of the present invention is to provide a multi-layer array type LED device with high luminous efficiency, which is capable of completely preventing moisture from permeating into the fluorescent layer and the optical elements disposed therein.

In order to achieve the above-mentioned objective, the present invention provides a multi-layer array type LED device comprising: a substrate, including a surface, a light output portion, and a plurality of encapsulation holes, at least one circumferential ring groove being formed around the outer periphery of light output portion, the substrate having an outer circumferential edge, the encapsulation holes being arranged around the outer periphery of the substrate near the outer circumferential edge; an encapsulation body, encapsulating the outer circumferential edge, an upper and lower periphery of the substrate, the encapsulation holes, and the circumferential ring groove, an optical chamber being formed by surrounding of the encapsulation body, the optical chamber having a light output opening corresponding to the light output portion, the optical chamber having an inner sidewall, the encapsulation body having a top surface, the inner sidewall of the optical chamber being inclined relative to a bottom surface of the optical chamber, a sealing surface extending outwardly from the top end portion of the inner sidewall being provided, there being a height difference between the sealing surface and the top surface of the encapsulation body; two lead frames, spaced apart from the substrate, and covered by the encapsulation body, two ends of each lead frame being exposed to an outside of the encapsulation body; a plurality of LED dices, arranged on the bottom surface of the optical chamber, the LED dices being electrically connected to the two lead frames; a dice protection layer, disposed on the LED dices; an optical grease layer, disposed on the dice protection layer; a fluorescent layer, disposed on the optical grease layer; a silica gel protection layer, disposed on the fluorescent layer; and a set of optical lens, used to tightly seal the light output opening.

Among them, the reflection coefficient of the optical grease layer is at least larger than 1.5 so that the probability of the light emitted out of the optical chamber is increased.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

Figure 1:
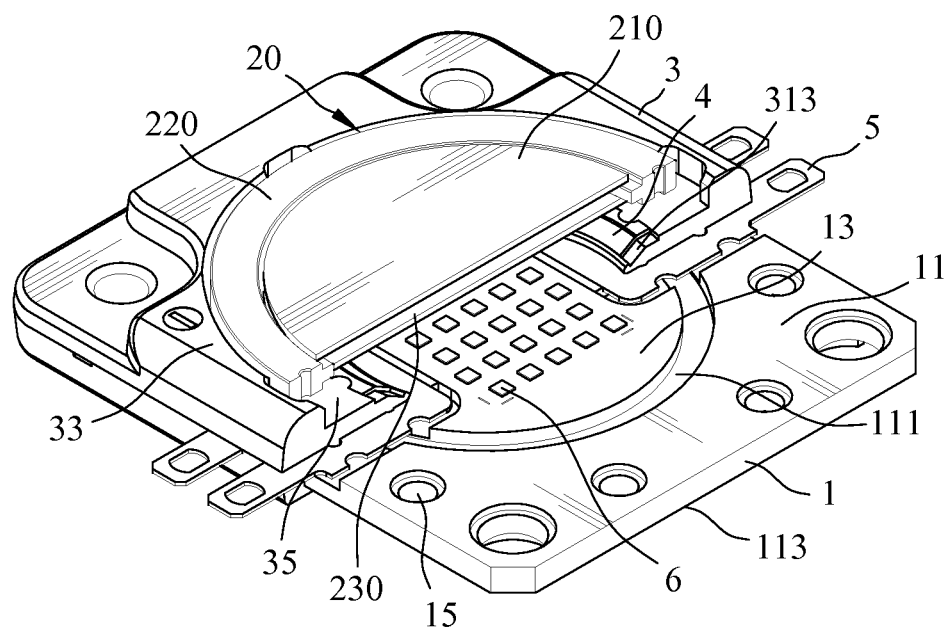
FIG. 1 is a perspective view of a multi-layer array type LED device according to the present invention.

FIG. 1 is a perspective view of a multi-layer array type LED device which is capable of completely preventing moisture from permeating into the optical elements disposed therein according to the present invention. Referring to FIG. 1, the multi-layer array type LED device of the present invention comprises a substrate 1, an encapsulation body 3, two lead frames 5, a plurality of LED dices 6, and a set of optical lens 20. The substrate 1 has a surface 11, a light output portion 13, and a plurality of encapsulation holes 15. The light output portion 13 is arranged on the central portion of the surface 11. At least one circumferential ring groove 111 is formed around the outer periphery of light output portion 13 on the surface 11 of the substrate 1. The circumferential ring groove 111 is not restricted to be ring-shaped as this embodiment, but it can be any other suitable shape. The substrate 1 has an outer circumferential edge 113. The plurality of encapsulation holes 15 are arranged around the outer periphery of the substrate 1 near the outer circumferential edge 113.

Figure 2:
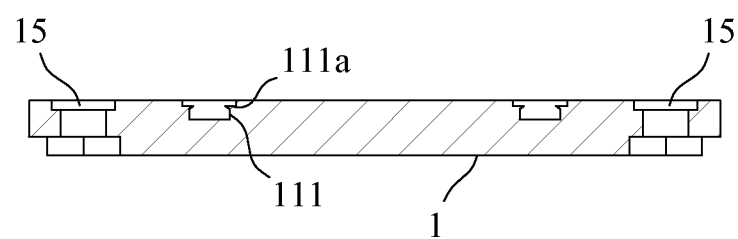
FIG. 2 is a cross-sectional view of one circumferential ring groove with a hook portion in the multi-layer array type LED device according to one embodiment of the present invention.

The cross-section of the at least one circumferential ring groove 111 can be in V shape, concaved shape, U shape or any other suitable shape. The at least one circumferential ring groove 111 preferably has a hook portion 111a provided at the upper inner edge thereof, as shown in FIG. 2.

Figure 3:
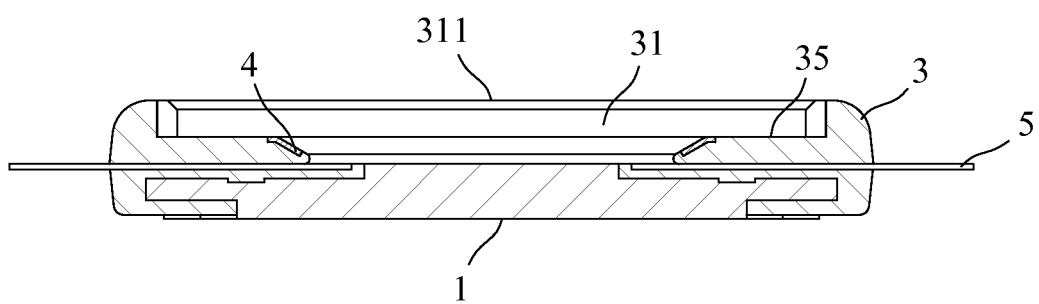
FIG. 3 is a cross-sectional view of the encapsulated substrate according to one embodiment of the present invention.

FIG. 3 is a cross-sectional view of the encapsulated substrate according to one embodiment of the present invention. Referring to FIG. 3, the outer circumferential edge 113, and the upper and lower periphery of the substrate 1, the plurality of encapsulation holes 15, and the circumferential ring groove 111 are completely encapsulated by the encapsulation body 3. An optical chamber 31 is formed by the surrounding of the encapsulation body 3. The optical chamber 31 has a light output opening 311 corresponding to the light output portion 13. The optical chamber 31 has an inner sidewall 313, and the encapsulation body 3 has a top surface 33, wherein the inner sidewall 313 of the optical chamber 31 is inclined relative to the bottom surface of the optical chamber 31, and thus to allow the light to be reflected and emitted upwardly. A sealing surface 35 which extends outwardly from the top end portion of the inner sidewall 313 is provided. There is a height difference between the sealing surface 35 and the top surface 33 of the encapsulation body 3. A light reflector can be arranged on the inner sidewall 313 of the optical chamber 31.

The two lead frames 5 are spaced apart from the substrate 1, and covered by the encapsulation body 3, but two ends of each lead frame 5 are exposed to the outside of the encapsulation body 3.

Figure 4:
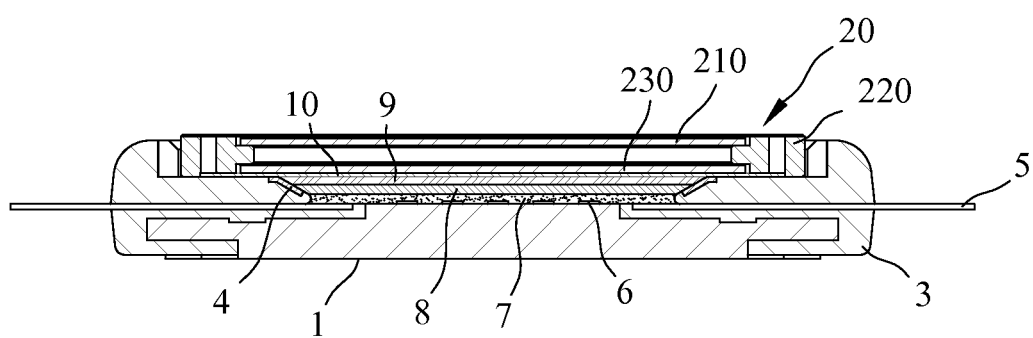
FIG. 4 is a cross-sectional view of the multi-layer array type LED device according to one embodiment of the present invention.

FIG. 4 is a cross-sectional view of the multi-layer array type LED device which is capable of completely preventing moisture from permeating into the optical elements disposed therein according to one embodiment of the present invention. Referring to FIG. 4, the LED dices 6 are arranged on the bottom surface of the optical chamber 31. When the LED dices 6 emit light, the emitted light can be reflected by the light reflector 4 and emitted upwardly, so that the light-emitting brightness and efficiency are effectively increased. The LED dices 6 are preferably arranged in an array manner, wherein the LED dices 6 are electrically connected to each other through wire bonding, and the LED dices 6 are electrically connected to the inner ends of the two lead frames 5 so as to form an electric circuit, and the outer ends of the two lead frames 5 are connected to the power source.

A dice protection layer 7 is disposed on the LED dices 6 for covering and protecting the LED dices 6. An optical grease layer 8 is disposed on the dice protection layer 7, a fluorescent layer 9 is disposed on the optical grease layer 8, and a silica gel protection layer 10 is disposed on the fluorescent layer 9. The fluorescent layer 9 is disposed between the optical grease layer 8 and the silica gel protection layer 10. The reflection coefficient of the optical grease layer 8 is at least larger than 1.5.

Figure 5:
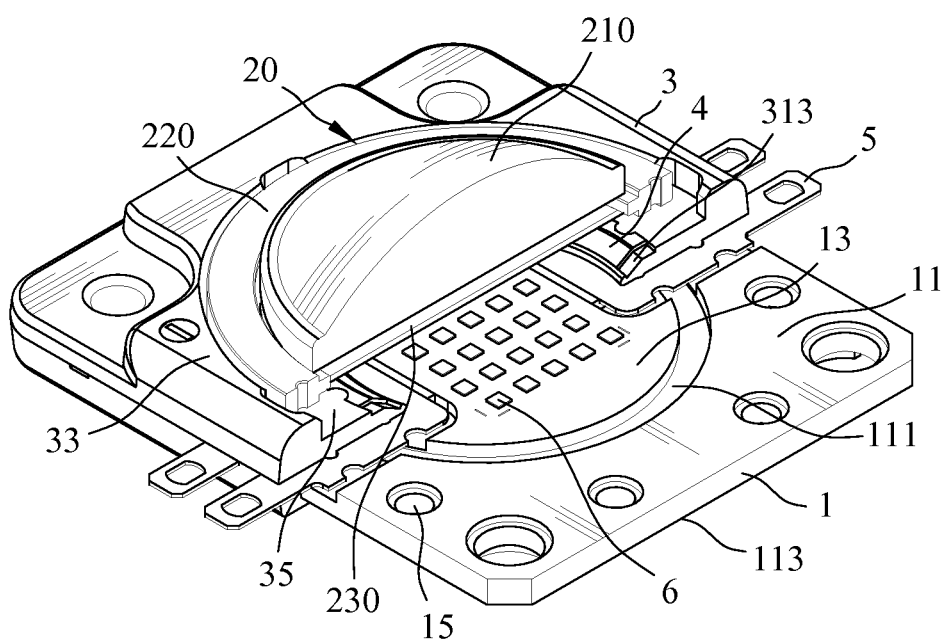
FIG. 5 is a perspective view of the multi-layer array type LED device of the present invention.

The set of optical lens 20 is used to tightly seal the light output opening 311 for preventing moisture from permeating into the optical elements disposed in the multi-layer array type LED device. The set of optical lens 20 is consisted of an upper lens 210, a spacer ring 220, and a lower lens 230. The upper lens 210 and the lower lens 230 can be arranged on the spacer ring 220. The set of optical lens 20 is tightly sealed to the sealing surface 35 through the tight contact between the spacer ring 220 and the sealing surface 35. The upper lens 210 can be a plane lens, a concave lens, a curved lens, or a convex lens, as shown in FIG. 5.

Figure 6:
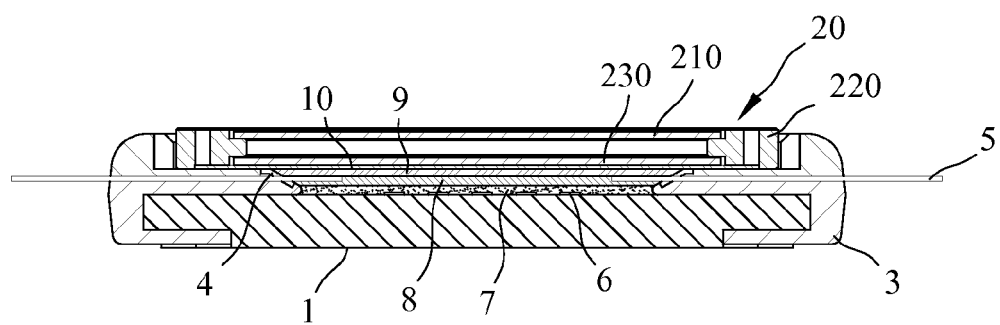
FIG. 6 is a cross-sectional view of the multi-layer array type LED device according to another embodiment of the present invention.
Figure 7:
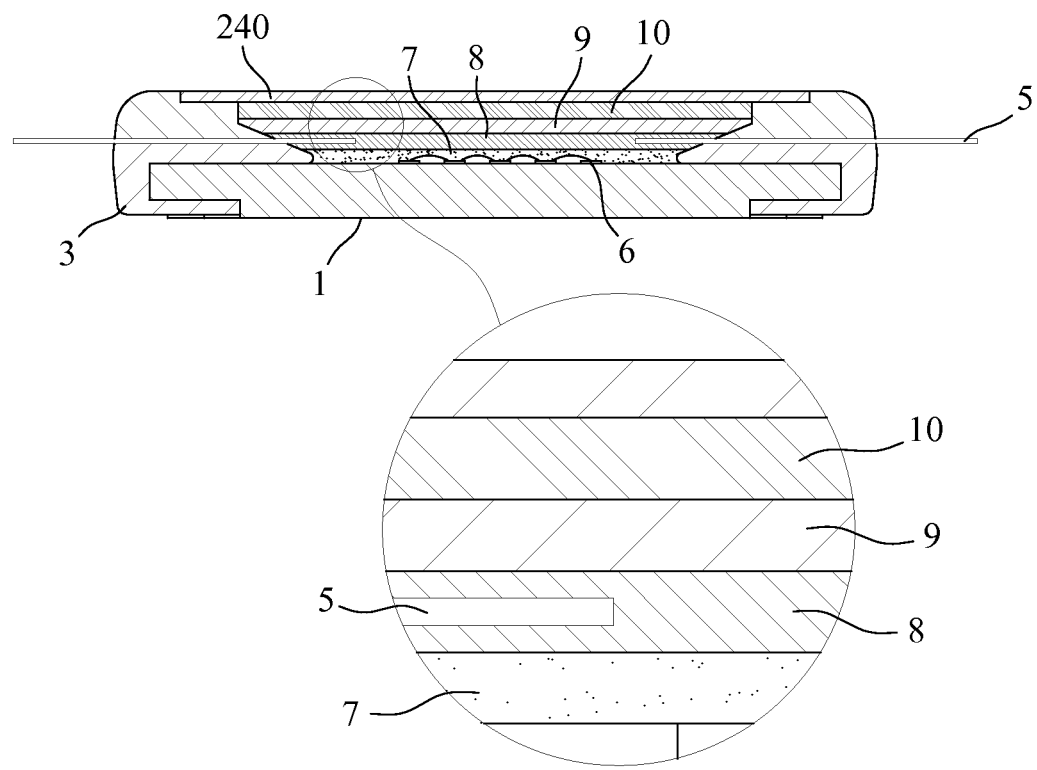
FIG. 7 is a cross-sectional view of the multi-layer array type LED device according to another embodiment of the present invention.

FIG. 6 is a cross-sectional view of the multi-layer array type LED device which is capable of completely preventing moisture from permeating into the optical elements disposed therein according to another embodiment of the present invention. FIG. 7 is a cross-sectional view of the multi-layer array type LED device which is capable of completely preventing moisture from permeating into the optical elements disposed therein according to another embodiment of the present invention. Referring to FIGS. 6 and 7, the two lead frames 5 are sealed in the encapsulation body 3, and the ends of the two lead frames 5 are inserted into the optical grease layer 8. Therefore, when the heat produced by light emitted from the LED dices 6 is transferred to the two lead frames 5, and enters the interior of the multi-layer array type LED device, the fluorescent layer 9 will not be affected, and will not be deteriorated by heat.

Referring to FIG. 7, only one optical lens 240 can be used instead of a set of optical lens 20. On the other hand, the thicknesses and the relative proportions of the dice protection layer 7, the optical grease layer 8, the fluorescent layer 9, and the silica gel protection layer 10 depend on the needs of the application.

In the present invention, the outer circumferential edge 113, the upper and lower periphery of the substrate 1, the encapsulation holes 15, and the circumferential ring groove 111 are completely encapsulated by the encapsulation body 3, and because the encapsulation holes 15 and the circumferential ring groove 111 are provided, the substrate 1 can be tightly encapsulated by the encapsulation body 3.

Because the fluorescent layer 9 is formed between the optical grease layer 8 and the silica gel protection layer 10, the fluorescent layer 9 is protected, and is capable of preventing moisture from permeating therein. On the other hand, the reflection coefficient of the optical grease layer 8 is at least larger than 1.5, and thereby the light reflection efficiency of the multi-layer array type LED device of the present invention can be improved. The multiple sealing structure of the multi-layer array type LED device of the present invention is capable of completely preventing moisture from permeating into the optical elements disposed therein, and also the light-emitting brightness and efficiency of the multi-layer array type LED device of the present invention are effectively increased.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A multi-layer array type LED device, comprising:
a substrate, including a surface, a light output portion, and a plurality of encapsulation holes, at least one circumferential ring groove being formed around an outer periphery of the light output portion, the substrate having an outer circumferential edge, the encapsulation holes being arranged around an outer periphery of the substrate near the outer circumferential edge;

an encapsulation body, encapsulating the outer circumferential edge, an upper and lower periphery of the substrate, the encapsulation holes, and the circumferential ring groove, an optical chamber being formed by surrounding of the encapsulation body, the optical chamber having a light output opening corresponding to the light output portion, the optical chamber having an inner sidewall, the encapsulation body having a top surface, the inner sidewall of the optical chamber being inclined relative to a bottom surface of the optical chamber, a sealing surface extending outwardly from a top end portion of the inner sidewall being provided, there being a height difference between the sealing surface and the top surface of the encapsulation body;

two lead frames, spaced apart from the substrate, and covered by the encapsulation body, two ends of each lead frame being exposed to an outside of the encapsulation body;

a plurality of LED dices, arranged on the bottom surface of the optical chamber, the LED dices being electrically connected to the two lead frames;

a dice protection layer, disposed on the LED dices;

an optical grease layer, disposed on the dice protection layer;

a fluorescent layer, disposed on the optical grease layer;

a silica gel protection layer, disposed on the fluorescent layer; and a set of optical lens, used to seal the light output opening;

wherein the set of optical lens comprises an upper lens, a spacer ring, and a lower lens, the upper lens and the lower lens are arranged on the spacer ring, and the set of optical lens is sealed to the sealing surface through a contact between the spacer ring and the sealing surface.

2. The multi-layer array type LED device according to claim 1, wherein a light reflector is arranged on the inner sidewall of the optical chamber.

3. The multi-layer array type LED device according to claim 1, wherein a reflection coefficient of the optical grease layer is at least larger than 1.5.

4. The multi-layer array type LED device according to claim 1, wherein a cross-section of the at least one circumferential ring groove is in V shape, concaved shape, or U shape.

5. The multi-layer array type LED device according to claim 1, wherein the at least one circumferential ring groove has a hook portion provided at the an upper inner edge thereof.

\* \* \* \* \*